United States Patent
Murakami et al.

(10) Patent No.: US 11,064,299 B2
(45) Date of Patent: Jul. 13, 2021

(54) MEMS STRUCTURE, CAPACITIVE SENSOR, PIEZOELECTRIC SENSOR, ACOUSTIC SENSOR HAVING MEMS STRUCTURE

(71) Applicant: OMRON Corporation, Kyoto (JP)

(72) Inventors: Ayumu Murakami, Kyoto (JP); Tadashi Inoue, Shiga (JP); Yasuhiro Horimoto, Shiga (JP)

(73) Assignee: Omron Corporation, Kyoto (JP)

( * ) Notice: Subject to any disclaimer, the term of this patent is extended or adjusted under 35 U.S.C. 154(b) by 0 days.

(21) Appl. No.: 16/315,965

(22) PCT Filed: Feb. 21, 2017

(86) PCT No.: PCT/JP2017/006396
§ 371 (c)(1),
(2) Date: Jan. 7, 2019

(87) PCT Pub. No.: WO2018/008181
PCT Pub. Date: Jan. 11, 2018

(65) Prior Publication Data
US 2019/0349687 A1    Nov. 14, 2019

(30) Foreign Application Priority Data
Jul. 8, 2016   (JP) .............................. JP2016-135971

(51) Int. Cl.
*H04R 25/00*   (2006.01)
*H04R 7/22*    (2006.01)
(Continued)

(52) U.S. Cl.
CPC ............. *H04R 7/22* (2013.01); *B81B 3/0021* (2013.01); *H04R 1/02* (2013.01); *H04R 7/08* (2013.01);
(Continued)

(58) Field of Classification Search
CPC .......... B81B 2201/0257; B81B 3/0021; H04R 17/02; H04R 1/02; H04R 7/08; H04R 7/22
(Continued)

(56) References Cited

U.S. PATENT DOCUMENTS 5,452,268 A     9/1995   Bernstein
5,852,337 A *  12/1998   Takeuchi ............ H01L 41/047
                                                            310/328
(Continued)

FOREIGN PATENT DOCUMENTS

CN          1874616 A      12/2006
CN       201032749 Y        3/2008
(Continued)

OTHER PUBLICATIONS

International Search Report issued in Application No. PCT/JP2017/006396, dated May 16, 2017 (1 page).
(Continued)

*Primary Examiner* — Phylesha Dabney
(74) *Attorney, Agent, or Firm* — Osha Bergman Watanabe & Burton LLP

(57) ABSTRACT

A MEMS structure that includes: a substrate having an opening; a diaphragm arranged opposite the opening in the substrate; a plurality of anchors securing the diaphragm to the substrate or to another component; and a fixed membrane surrounding the diaphragm over a slit. The outline of the diaphragm protrudes toward the anchors and includes a predetermined intersecting structure that when viewed from the normal to the diaphragm, the diaphragm protrudes toward the anchors in at least one location on the diaphragm between two intersection points of the outline of the diaphragm and the outline of the opening in the substrate. The intersecting structure is configured such that the distance (Continued)

between the two intersection points is greater than the width of the diaphragm at a location closest to an anchor.

12 Claims, 33 Drawing Sheets

(51) Int. Cl.
  *B81B 3/00* (2006.01)
  *H04R 1/02* (2006.01)
  *H04R 7/08* (2006.01)
  *H04R 17/02* (2006.01)
(52) U.S. Cl.
  CPC ...... *H04R 17/02* (2013.01); *B81B 2201/0257* (2013.01)
(58) Field of Classification Search
  USPC .......................................................... 381/191
  See application file for complete search history.

(56) References Cited

U.S. PATENT DOCUMENTS

| | | | |
|---|---|---|---|
| 6,168,906 | B1 | 1/2001 | Bernstein et al. |
| 7,146,016 | B2* | 12/2006 | Pedersen ............... B81B 3/0072 381/175 |
| 9,118,994 | B2* | 8/2015 | Uchida .................... H04R 7/06 |
| 9,199,837 | B2* | 12/2015 | Kasai .................... B81B 7/0016 |
| 9,462,364 | B2* | 10/2016 | Uchida .................... H04R 1/08 |
| 2002/0067663 | A1* | 6/2002 | Loeppert ............... B81B 3/0072 367/181 |
| 2008/0232615 | A1* | 9/2008 | Song .................... H04R 19/005 381/174 |
| 2010/0176821 | A1* | 7/2010 | Kasai .................... H04R 19/04 324/660 |
| 2011/0048138 | A1 | 3/2011 | Li |
| 2011/0278684 | A1 | 11/2011 | Kasai |
| 2011/0280419 | A1* | 11/2011 | Kasai ....................... H04R 1/06 381/176 |
| 2013/0069179 | A1 | 3/2013 | Ishimoto et al. |
| 2013/0089224 | A1 | 4/2013 | Dehe et al. |
| 2013/0264663 | A1 | 10/2013 | Dehe et al. |
| 2014/0267508 | A1* | 9/2014 | Ohashi ................ B41J 2/14233 347/70 |
| 2016/0037266 | A1 | 2/2016 | Uchida |
| 2019/0342671 | A1* | 11/2019 | Jung ..................... H04R 19/04 |
| 2019/0349687 | A1* | 11/2019 | Murakami ............... H04R 7/22 |

FOREIGN PATENT DOCUMENTS

| | | |
|---|---|---|
| CN | 201733432 U | 2/2011 |
| CN | 102244827 A | 11/2011 |
| CN | 102325294 A | 1/2012 |
| CN | 102907118 A | 1/2013 |
| CN | 205017582 U | 2/2016 |
| DE | 11 2013 006 821 T5 | 12/2015 |
| EP | 2 386 840 A2 | 11/2011 |
| JP | 2011-239324 A | 11/2011 |

OTHER PUBLICATIONS

Written Opinion issued in Application No. PCT/JP2017/006396, dated May 16, 2017 (3 pages).

Office Action issued in Chinese Application No. 201780042283.8, dated Mar. 16, 2020 (15 pages).

Office Action in counterpart German Patent Application No. 112017003453.1 dated Oct. 14, 2020 (20 pages).

* cited by examiner

Cross-section A - A'

Cross-section B - B'

MEMS STRUCTURE, CAPACITIVE SENSOR, PIEZOELECTRIC SENSOR, ACOUSTIC SENSOR HAVING MEMS STRUCTURE

CROSS REFERENCE TO RELATED APPLICATIONS

The present patent application is a national phase application of International Application No. PCT/JP2017/006396, filed on Feb. 21, 2017, which claims priority to Japanese Patent Application No. 2016-135971, filed on Jul. 8, 2016. The contents of these applications are incorporated herein by reference in their entirety.

TECHNICAL FIELD

One or more embodiments relate to a micro electromechanical systems (MEMS) structure, a capacitive sensor or piezoelectric sensor having the MEMS structure, and an acoustic sensor with said capacitive sensor or piezoelectric sensor. More specifically, one or more embodiments relate to a capacitive sensor, piezoelectric sensor, and an acoustic sensor where the diaphragm is formed using MEMS manufacturing techniques.

BACKGROUND

The acoustic sensor, which may be referred to as an electret condenser microphone, has traditionally been used in electronic devices as a small faun-factor microphone. However, an ECM is quite susceptible to heat. Moreover, microphones using capacitive sensors manufactured using microelectromechanical systems (MEMS) techniques outperform the ECM in terms of digitization and small size. This has led to increasing adoption of the MEMS microphone in recent years; see, for example U.S. Pat. No. 5,452,268.

The above-described capacitive sensor may be realized using MEMS processing techniques to arrange a diaphragm opposite a back plate with an air gap. The diaphragm vibrates due to pressure. An electrode film is also secured to the back plate. The diaphragm and a sacrificial layer for covering the diaphragm may be formed on a silicon substrate; a sacrificial layer may also be formed thereafter on the back plate; the sacrificial layer may then be removed to thus realize the above kind of capacitive sensor. Given that semiconductor manufacturing techniques are thus applied in MEMS processing techniques, it is possible to obtain an extremely small capacitive sensor.

FIG. 18A is a partial cross-sectional view illustrating components of a conventional capacitive sensor 100 (also referred to as a MEMS sensor below) produced via the above mentioned MEMS processing techniques. In FIG. 18A, a diaphragm 102 and a back plate 103 are formed on a silicon substrate 101. The traditional MEMS sensor 100 includes region A, where the diaphragm 102 and the silicon substrate 101 overlap when viewed along a line normal to the diaphragm 102.

In this case, Brownian motion of the air in the region A may create acoustic noise; when this acoustic noise is created it degrades the signal-to-noise ratio of the capacitive sensor. In contrast, as illustrated in FIG. 18B the sensor may be constructed so that the diaphragm 112 and the silicon substrate 111 do not overlap when viewed along a line normal to the diaphragm 112. In this case, air escapes from the gap between the diaphragm 112 and the silicon substrate 111, reducing the acoustic resistance and reducing the sensitivity of the sensor as an acoustic sensor.

In contrast, as illustrated in FIG. 19A, one proposal for securing the acoustic resistance involves providing a fixed membrane 124 around the diaphragm 122 and placing a fine slit 122a between the diaphragm 122 and the fixed membrane 124. This configuration thus avoids Brownian motion of the air which reduces the signal-to-noise ratio while preventing a reduced acoustic resistance and guarantees the sensitivity of the acoustic sensor.

FIG. 19A illustrates one or more embodiments where the fixed membrane 124 is secured to the back plate 123 for the same reason. In the one or more embodiments illustrated in FIG. 19A, the fixed membrane 124 is secured to the substrate 121 via an anchor 125 formed by way of an oxidized film. However there are cases where the anchor 125 is lost due to the variations in the production process; in that case, the fixed membrane 124 separates from this substrate 121 and is unable to fulfill its function of securing the acoustic resistance. In FIG. 19B, the fixed membrane 124 is secured to the back plate 123 in one or more embodiments. Hereby, even if the anchor 125 is lost, the fixed membrane 124 remains secured to the back plate 123. Therefore, the fixed membrane 124 is able to fulfill its function of securing the acoustic resistance.

Incidentally, in some cases, a large pressure may act on the diaphragm 122 from the silicon substrate 121 in a MEMS sensor 120 provided with a fixed membrane 124 similarly to the above-mentioned traditional techniques. In this case, the diaphragm 122 deforms toward the back plate 123, touches the backplate 123 and is thereby prevented from deforming beyond a fixed amount. Additionally, at that point the slit 122a between the diaphragm 122 and the fixed membrane 124 widens allowing air to escape from the slit 122a and acting to reduce the pressure.

In contrast, when a large pressure acts on the diaphragm 122 from the direction of the back plate 123, the diaphragm 122 may enter an opening (the back chamber 121a) in the silicon substrate 121 since there is no region of the diaphragm 122 and the silicon substrate 121 that overlap when viewing the diaphragm from along the normal. This causes a large displacement of the diaphragm 122 with the resulting stress concentrating on a beam (not shown) supporting the diaphragm 122.

This issue may occur when the aforementioned capacitive sensor is dropped; this situation may also occur, for example, when a large acoustic pressure acts on the sensor due to a loud sound, or when the sensor is under an air blower during the packaging stage.

SUMMARY

One or more embodiments provide a capacitive sensor, piezoelectric sensor, or acoustic sensor manufactured using MEMS processing techniques capable of achieving a high signal-to-noise ratio, and provides techniques for improving the robustness of said sensors with respect to the input pressure.

A MEMS structure according to one or more embodiments includes: a substrate having an opening;
a diaphragm arranged opposite the opening in the substrate;
a plurality of anchors securing the diaphragm to the substrate or to another component; and a fixed membrane surrounding the diaphragm over a slit;
the outline of the diaphragm protrudes toward the anchors; and includes a predetermined intersecting structure that when viewed from the non rat to the diaphragm, the diaphragm protrudes toward the anchors in at least one location on the diaphragm between two intersection points of the outline of the diaphragm and the outline of the opening in the substrate;

the intersecting structure configured such that:

the distance between the two intersection points is greater than the width of the diaphragm at a location closest to an anchor.

The MEMS structure according to one or more embodiments includes a predetermined intersecting structure that when viewed from the normal to the diaphragm, the diaphragm protrudes toward the anchors in at least one location on the diaphragm between two intersection points of the outline of the diaphragm and the outline of the opening in the substrate. Therefore, when viewed from the normal, the diaphragm and the substrate include a gap at one portion, and overlap at another portion. Thus, the region that the diaphragm and the substrate overlap when viewed from the normal is not limited to one portion of the outline of the diaphragm; therefore, this minimizes the noise generated due to Brownian motion of the air. In contrast, preserving a region where the diaphragm and the substrate overlap when viewed from the normal, thus makes it possible to avoid excessive displacement of the diaphragm even when the diaphragm is subject to a large pressure from the back plate. This is because the diaphragm and the substrate mutually touch in this region of overlap. The resulting capacitive sensor and the piezoelectric sensor have both a high signal-to-noise ratio and are robust to the input pressure.

The distance between the two intersection points in the intersecting structure is greater than the width of the diaphragm at a location closest to the anchor. Therefore, the width of the diaphragm may be kept narrow near the anchor, while widening the diaphragm between the intersection points where the outlines of the diaphragm and the opening in the substrate intersect.

Thus, retaining a narrow width for the diaphragm near the anchor increases the sensitivity of the diaphragm to acoustic pressure. Additionally, widening the diaphragm between intersection points mitigates the concentration of stress on the diaphragm.

The outline of the diaphragm may include an inflection point near the intersection point. Thus, further increasing the effect when the width of the diaphragm is kept narrow near the anchor, while widening the diaphragm between the intersection points where the outlines of the diaphragm and the opening in the substrate intersect.

The outline of the diaphragm may be a polygon or substantially a polygon; and, the length of a section on one side of the outline of the diaphragm located outside the outline of the opening in the substrate may be no less than 1/20 and no more than 1/3 the length of the one side. Hereby, it is possible favorable maintain a balance between minimizing the noise due to Brownian motion of the air, and avoiding excessive displacement of the diaphragm. The resulting capacitive sensor and the piezoelectric sensor more reliably have both a high signal-to-noise ratio and are robust to the input pressure.

The diaphragm may be provided with a stopper projecting toward the substrate in a section of the outline of the diaphragm located outside the opening in the substrate, and the stopper may be configured to touch the substrate when the diaphragm is displaced.

Hereby, the stopper can touch the substrates when the diaphragm is displaced toward the substrate, reducing the contact surface area between the diaphragm and the substrate; therefore, this prevents the diaphragm from sticking to the substrate.

The MEMS structure may further include a fixed membrane surrounding the diaphragm over a slit. This prevents unintended reduction in the pressure acting on the diaphragm when air escapes from around the diaphragm, and thus improves the sensitivity of the capacitive sensor. Note that the width of the slit may be less than 3 µm, and may be 0.2 µm to 0.6 µm.

Additionally, when providing a fixed membrane surrounding the diaphragm over a slit, the fixed membrane is configured to completely surround the diaphragm, and the slit is configured as a closed curve.

Therefore, this prevents the end of the slit from opening into the outer part of the fixed membrane when viewed from the normal, and prevents intrusion of foreign particles from said opening part.

A region in the outline of the diaphragm creating an angle of no more than 3° with the outline of the opening in the substrate that is closest thereto may be no less than 1 µm from the outline of the opening in the substrate.

Here, the edge of the outline of the diaphragm may be caught on the edge of the opening when a pressure displaces the diaphragm, the diaphragm enters the opening, and the diaphragm attempts to return to its initial position. If the outline of the diaphragm and the outline of the opening in the substrate are almost parallel and are close by no less than a certain extent, the diaphragm may fail to return to its original position.

Thus, in one or more embodiments, a region in the outline of the diaphragm creating an angle of no more than 3° with the outline of the opening in the substrate that is closest thereto is established as no less than 1 µm from the outline of the opening in the substrate. Hereby, the section of the outline of the diaphragm almost parallel to the opening in the substrate closest thereto may be arranged at a fixed distance or more from the outline of the substrate; this prevents the edge of the diaphragm from being caught on the edge of the opening of the substrate.

The closest outline of the opening substrate may be the portion of the outline with the shortest distance to a predetermined region on the outline of the diaphragm. This may also be the portion of the outline of the opening in the substrate that intersects with a line perpendicular to the predetermined region when viewed from the normal to the diaphragm. Alternatively, the closest outline of the opening substrate may be where the outline of the opening in the substrate intersects with a straight line drawn from the center part of the diaphragm (i.e., the intersection of symmetry lines when the diaphragm is quadrilateral; or the center when the diaphragm is a circle) passes through the aforementioned region when viewed from the normal to the diaphragm.

The outline of the diaphragm may have an intersection angle of no less than 30° when the outline of the diaphragm intersects with the outline of the opening in the substrate. Thus, it is possible to minimize changes in the surface area where the outline of the diaphragm is outside the outline of the opening in the substrate. This can be accomplished even if there are differences in the location of the outline when producing the opening in the substrate. In other words, it is possible to stabilize the size of the area where the diaphragm overlaps the substrate outside the opening in a plan view. Note that, the intersection angle is the acute (smaller) angle created between the outline of the opening in the substrate and the intersecting outline of the diaphragm. The outline of the opening in the substrate and the outline of the diaphragm create an intersection angle of 90° when the outlines are perpendicular.

The section of the outline of the diaphragm inward of the opening in the substrate when viewed from the normal to the diaphragm may be located at the center part of one side of the polygon or a curve making up the closed curve, and the section of the outline of the diaphragm outward of the opening in the substrate when viewed from the normal to the diaphragm may be located at both ends of the center part of one side of the polygon or the curve making up the closed curve.

Thus, it is possible to limit the displacement of the diaphragm in the sections near the supports when the diaphragm displaces toward the opening in the substrate; hereby, when the diaphragm displaced, the concentration of stress at the support is more reliably mitigated.

A capacitive sensor according to one or more embodiments may include any of the above mentioned MEMS structures; and a backplate arranged opposite the diaphragm with an air gap therebetween. In this case, the anchor may secure the diaphragm to the back plate.

A piezoelectric sensor according to one or more embodiments may include any of the above described MEMS structures with the diaphragm exhibiting the piezoelectric effect.

An acoustic sensor according to one or more embodiments may include the above described capacitive sensor, and the acoustic sensor converting acoustic pressure to changes in the capacitance between the diaphragm and the back plate to detect the acoustic pressure. An acoustic sensor according to one or more embodiments may include the above described piezoelectric sensor, and the acoustic sensor converts acoustic pressure to changes in the piezoelectric voltage on the diaphragm to detect the acoustic pressure. Thus, the acoustic sensor may achieve a high signal-to-noise ratio, and improve the robustness thereof to the input pressure.

As above described, one or more embodiments may be a capacitive sensor that converts the displacement of a diaphragm into changes in capacitance between the diaphragm and the back plate, or may be piezoelectric sensor that converts the displacement of a diaphragm that exhibits the piezoelectric effect into changes in the piezoelectric voltage; and a portion of the outline of the diaphragm is located inward of an opening in a substrate when viewed from the normal; and, other portions of the outline of the diaphragm are located outward of the opening in the substrate when viewed from the normal.

That is, a MEMS structure includes: a substrate having an opening;

and a diaphragm arranged opposite the opening in the substrate;

the diaphragm includes a support secured to the substrate; and an oscillating part that is displaced with pressure acting thereon; and in a capacitive sensor that converts the displacement of the diaphragm into changes in capacitance between the diaphragm and the back plate, or in a piezoelectric sensor that converts the displacement of the diaphragm exhibiting the piezoelectric effect into changes in the piezoelectric voltage;

a portion of the outline of the oscillating part is located inward of the opening in the substrate when viewed from the normal; and, other portions of the outline of the oscillating part are located outward of the opening in the substrate when viewed from the normal.

The diaphragm includes a substantially quadrilateral oscillating part; and supports that radiate from the four corners of the diaphragm and at the end parts thereof secure the diaphragm to the substrate;

the outline of the opening in the substrate is substantially quadrilateral;

the oscillating part of the diaphragm faces the opening in the substrate;

each side of the oscillating part is nonlinear; whereby, a portion of the outline of the oscillating part is located inward of the opening in the substrate when viewed from the normal; and, other portions of the outline of the oscillating part are located outward of the opening in the substrate when viewed from the normal.

In this case, for instance, if the sides of the oscillating part are corrugated when viewed from the normal, the outline of the oscillating part is outward of the opening in the substrate at the protruding sections, and inward of the opening in the substrate at the recessing sections. Hereby, a portion of the outline of the diaphragm may be more easily located inward of an opening in a substrate when viewed from the normal; and, other portions of the outline of the diaphragm may be more easily located outward of the opening in the substrate when viewed from the normal. This configuration also makes it easy to modify the width of the gap or the width of the overlap between the outline of the diaphragm and the opening in the substrate when viewed from the normal.

The diaphragm may include a substantially quadrilateral oscillating part; and supports that radiate from the four corners of the diaphragm and at the end parts thereof secure the diaphragm to the substrate;

the outline of the opening in the substrate is substantially quadrilateral;

the oscillating part of the diaphragm faces the opening in the substrate;

each side of the opening in the substrate is nonlinear; whereby, a portion of the outline of the oscillating part is located inward of the opening in the substrate when viewed from the normal; and, other portions of the outline of the oscillating part are located outward of the opening in the substrate when viewed from the normal.

In this case, for instance, if the sides of the opening in the substrate are corrugated when viewed from the normal, the outline of the oscillating part is inward of the opening in the substrate at the protruding sections, and outward of the opening in the substrate at the recessing sections. This also allows a portion of the outline of the oscillating part to be more easily located inward of an opening in a substrate when viewed from the normal; and, other portions of the outline of the oscillating part to be more easily located outward of the opening in the substrate when viewed from the normal. This configuration also makes it easy to modify the width of the gap or the width of the overlap between the outline of the oscillating part and the opening in the substrate when viewed from the normal.

The above-described one or more embodiments may be combined as appropriate and used.

One or more embodiments allow a capacitive sensor, piezoelectric sensor, or acoustic sensor manufactured using MEMS processing techniques to achieve a high signal-to-noise ratio, and improves the robustness of said sensors with respect to the input pressure.

DETAILED DESCRIPTION

One or more embodiments are described in detail with reference to the drawings. The following one or more embodiments are merely one aspect and in no way limit the technical scope. Note that while one or more embodiments may be adopted for all capacitive sensors, the one or more embodiments below describe a capacitive sensor used as an acoustic sensor. However, a capacitive sensor according to one or more embodiments may be used as another type of sensor, so long as the sensor detects the displacement of the diaphragm. In one or more embodiments, other than a pressure sensor, the capacitive sensor may be used as an accelerometer, an inertial sensor, or the like. Besides a sensor element, the capacitive sensor may be used as a speaker that converts electrical signals into displacement of the diaphragm. In one or more embodiments described below, the oscillating part of the diaphragm is substantially quadrilateral and includes four supports; and the outline of the opening in the substrate is also roughly four-sided. However, the effects sought may still be obtained even when the oscillating part of the diaphragm is not quadrilateral such as with a polygon or a closed curve such as a circle that includes a plurality of supports. The outline of the opening in the substrate may also be shapes other than four-sided, such as a polygon or a closed curve such as a circle.

Figure 1:
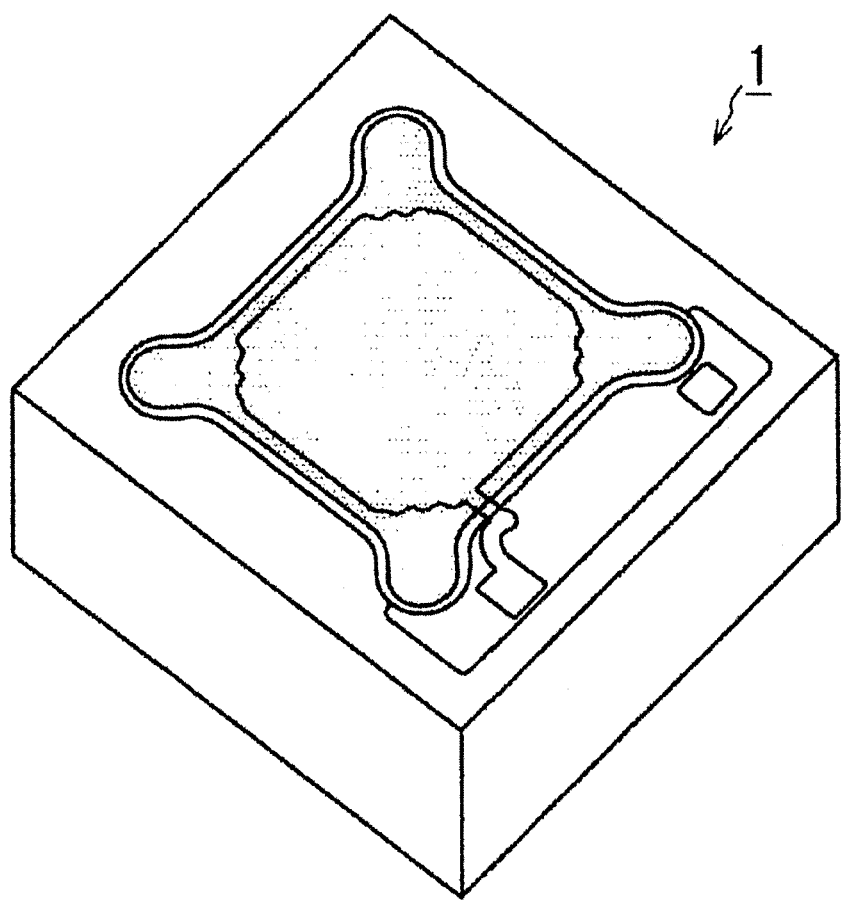
FIG. 1 is a perspective view illustrating one or more embodiments of a conventional acoustic sensor manufactured using MEMS processing techniques.
Figure 2:
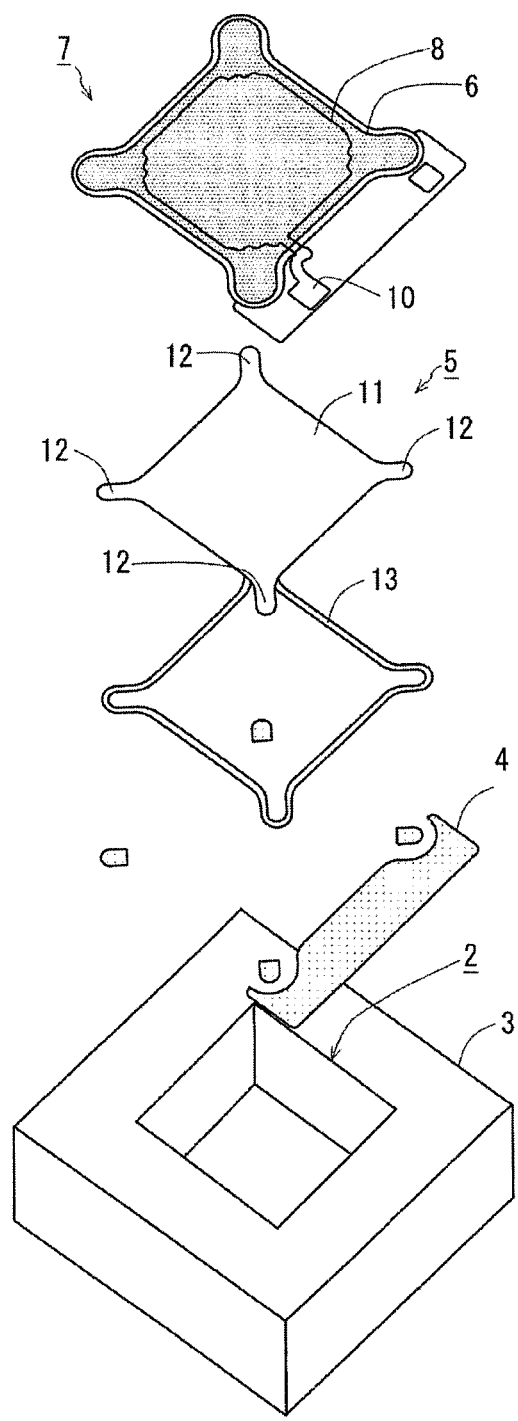
FIG. 2 is an exploded perspective view illustrating one or more embodiments of the internal structure of a conventional acoustic sensor.

FIG. 1 is a perspective view illustrating one or more embodiments of a conventional acoustic sensor 1 manufactured using MEMS processing techniques; FIG. 2 is an exploded perspective view illustrating one or more embodiments of the internal structure of the acoustic sensor 1. The acoustic sensor 1 includes a silicon substrate (substrate) 3 provided with a back chamber 2 which is an opening therein. The acoustic sensor 1 is a stacked body with an insulating film 4, a fixed membrane 13, a diaphragm 5 (oscillating electrode plate), and a back plate 7 layered on the upper surface of the substrate 3. The back plate 7 is structured so that a fixed electrode film 8 is deposited onto a fixed plate 6 with the fixed electrode film 8 on the side of the fixed plate 6 toward the silicon substrate 3. The fixed plate 6 in the back plate 7 is provided throughout with a plurality of perforations which function as sound ports (i.e., each dot in the mesh on the fix plate 6 in FIG. 1 on FIG. 2 represent individual dots). Additionally, a fixed electrode pad 10 is provided at one of the four corners of the fixed electrode film 8 for acquiring an output signal.

The silicon substrate 3 may be produced from a monocrystalline silicon. The diaphragm 5 may also be produced from a conductive polycrystalline silicon. The diaphragm 5 is flat with supports 12 arranged extending radially from the four corners (i.e., diagonally from) the oscillating part 11 which is substantially quadrilateral and which oscillates. The diaphragm 5 is disposed on the upper surface of the silicon substrate 3 to cover the back chamber 2 and is secured to the silicon substrate 3 via anchors (not shown) at the tips of the four supports 12. The oscillating part 11 of the diaphragm 5 reacts to acoustic pressure and oscillates vertically. Here, the supports 12 are shaped to substantially protrude toward the anchor.

The diaphragm 5 touches neither the silicon substrate 3 nor the back plate 7 outside the locations of the four supports 12. Thus, the diaphragm 5 is thus able to react more smoothly to the acoustic pressure. A diaphragm pad (not shown) is also provided at one of the supports 12 at the four corners of the oscillating part 11. The fixed electrode film 8 provided on the back plate 7 is opposite the oscillating part 11 of the diaphragm 5 outside the four corners for the supports 12.

Note that a fixed membrane 13 is formed surrounding the diaphragm 5 over a slit 5a once the acoustic sensor 1 is complete. The fixed membrane 13 is configured to be on substantially the same plane as the diaphragm 5. The fixed membrane 13 is secured to the substrate 3, and reacts to the acoustic pressure without oscillating. The fixed membrane 13 allows air causing the oscillating part 11 to move vertically to escape from around the diaphragm 5 and thus minimizes the degradation in the sensitivity of the acoustic sensor 1.

Once sound reaches the acoustic sensor 1, the sound passes through the sound ports and puts pressure on the diaphragm 5. That is, an acoustic pressure is applied to the diaphragm 5 via the sound ports. Providing the sound ports also tends to make it easy for the air in the air gap between the back plate 7 and the diaphragm 5 to escape, thus reducing the noise.

With the above-described configuration, the oscillating part 11 of the diaphragm 5 in the acoustic sensor 1 oscillates on receiving sound whereby the distance between the oscillating part 11 and the fixed electrode film 8 changes. The capacitance between the oscillating part 11 and the fixed electrode film 8 changes when the distance between the oscillating part 11 and the fixed electrode film 8 changes. Accordingly, a direct current may be applied between an oscillating film electrode pad 9 electrically connected to the diaphragm 5 and the fixed electrode pad 10 electrically connected to the fixed film 8, whereby the changes in the above-mentioned capacitance may be output electrically as a signal to thereby detect the acoustic pressure as an electrical signal.

Figure 3:
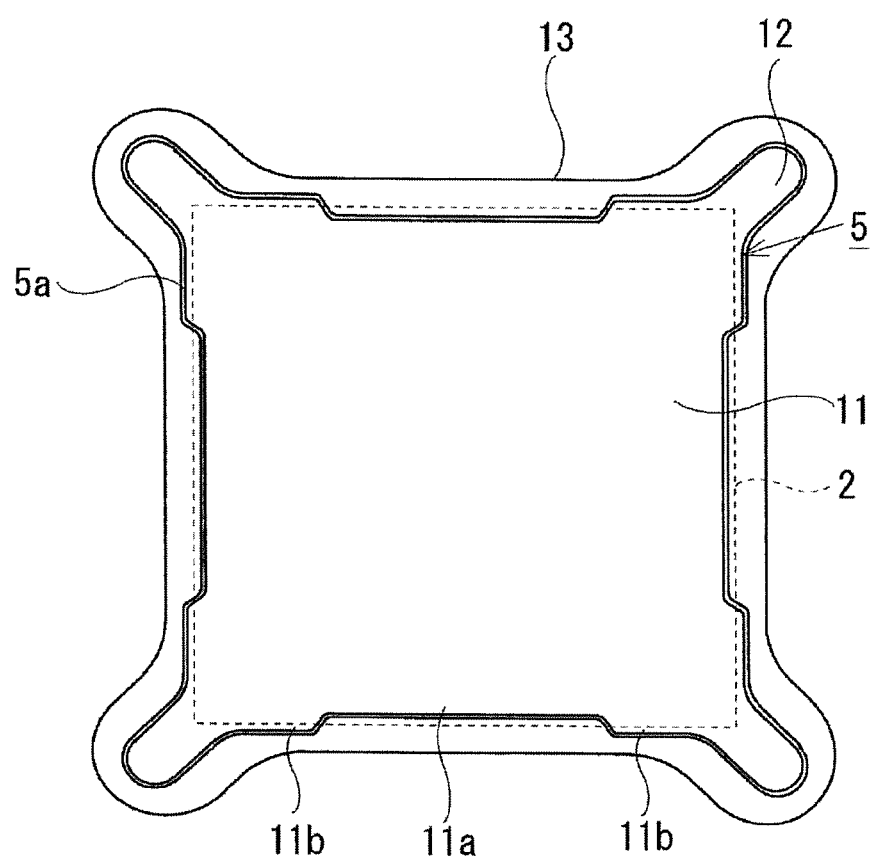
FIG. 3 illustrates the shape of the diaphragm and the fixed membrane according to one or more embodiments; and illustrates the relationship with the outline of the back chamber.

FIG. 3 illustrates the diaphragm 5 and the fixed membrane 13 of one or more embodiments from the normal to the diaphragm 5. The outline of the back chamber 2 which serves as an opening in the silicon substrate 3 is represented by dotted lines in FIG. 3. As illustrated in the drawing, the outline of the diaphragm 5 is defined by a slit 5a formed between the diaphragm 5 and the fixed membrane 13. For the sake of simplicity, the slit 5a is represented by a single line in drawings after FIG. 3.

The outline of the oscillating part 11 of the diaphragm 5 in one or more embodiments is formed inside the outline of the back chamber 2 at the center part 11a on each side and outside the outline of the back chamber 2 at end parts 11b of each side. In other words, the outline of the oscillating part 11 of the diaphragm 5 overlaps at only the end parts 11b of each side with the outline of the silicon substrate 3 outside the back chamber 2 in a plan view.

Hereby, the oscillating part 11 is displaced in a direction opposite the back plate 7 when a large stress acts from the back plate 7 toward the diaphragm 5. The end parts 11b of the displaced oscillating part 11 touches the silicon substrate 3 in an area near the outline of the back chamber 2 and suppresses further displacement of the oscillating part 11. Thus, it is possible to minimize the stress concentrating at the supports 12 even when a large stress is placed on the diaphragm 5 from the back chamber 7. It is thereby possible to prevent breakage of the supports 12 in particular due to excess displacement of the oscillating part 11 of the diaphragm 5. As a result, this improves the robustness of the acoustic sensor 1 to the input pressure.

Figure 4:
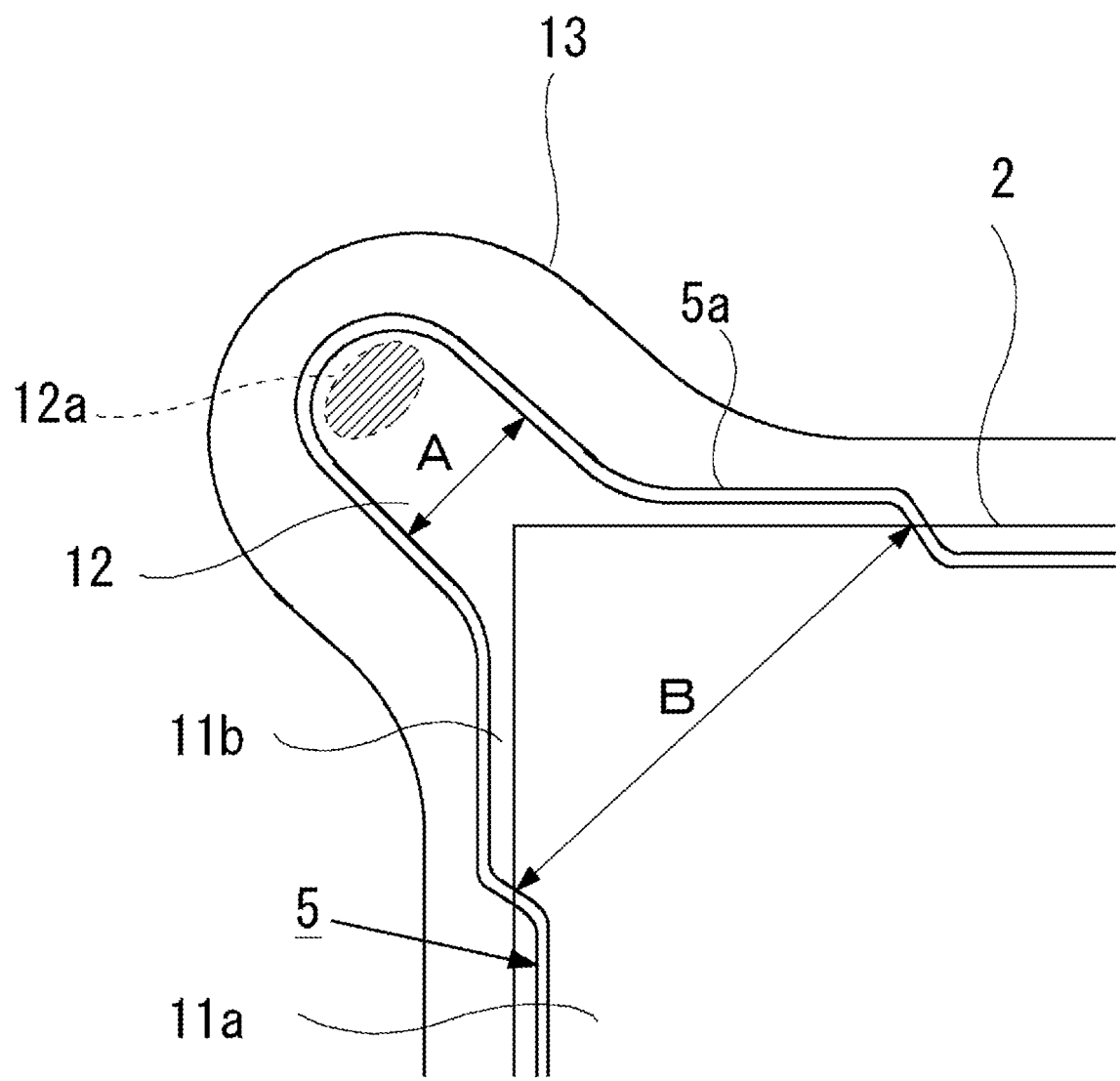
FIG. 4 is a first enlarged view of the supports for the diaphragm and near the end parts of the oscillating part in one or more embodiments.

FIG. 4 illustrates the supports 12 for the diaphragm 5 and near the end parts 11b of the oscillating part 11 in one or more embodiments. The outline of the oscillating part 11 in one or more embodiments is formed inside the outline of the back chamber 2 at a center part 11a on each side and outside the outline of the back chamber 2 at the end parts 11b of each side. The outline of the oscillating part 11 intersects the outline of the back chamber 2 in a region between the center part 11a and the end parts 11b. As a result, the outline of the diaphragm 5 intersects the outline of the back chamber 2 at two intersection points that sandwich the support 12. This section corresponds to the predetermined intersecting structure in one or more embodiments. Note that the anchor 12a at the tip of the support 12 is presented as hatchings in FIG. 4.

In one or more embodiments, a line segment B connects the intersection point between the outline of the oscillating part 11 of the diaphragm 5 and the outline of the back chamber 2, and another intersection point closest to the aforementioned intersection point on a different side of the oscillating part 11. The line segment B is configured to be longer than the width A of a support part 12 for the diaphragm 5. Hereby, the supports 12 ensure that the diaphragm 5 is highly sensitive to acoustic pressure and easily deforms when a pressure is applied thereto; the configuration also minimizes the stress concentrating at the supports 12 when the diaphragm 5 deforms. Note that the width A of the supports 12 is equivalent to the width of the diaphragm 5 near the anchor.

Figure 5:
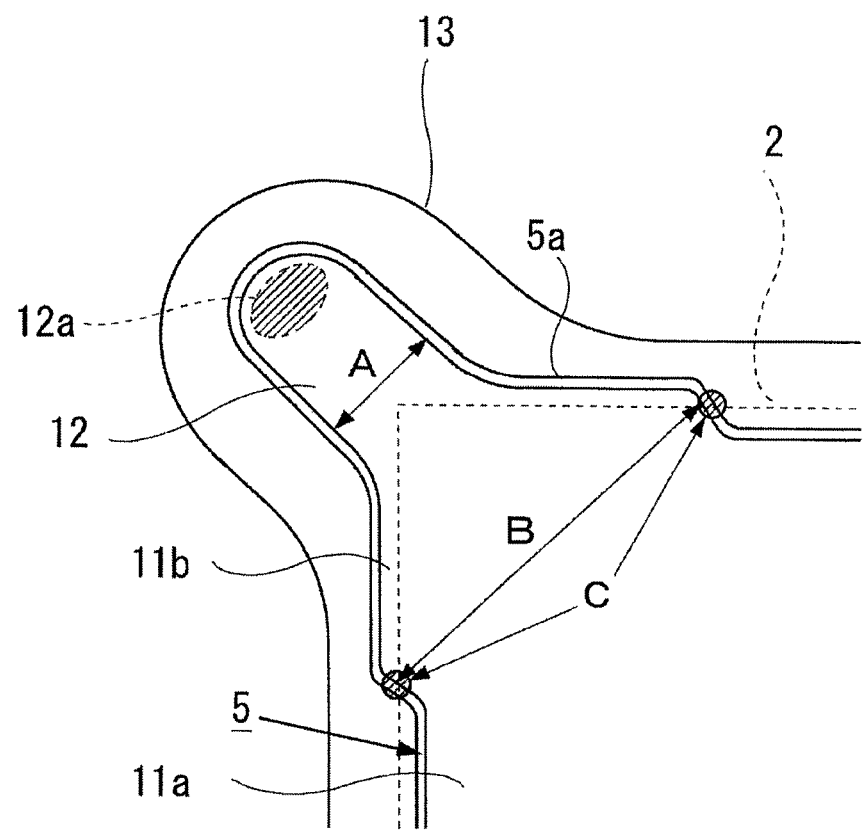
FIG. 5 is a second enlarged view of the supports for the diaphragm and near the end parts of the oscillating part in one or more embodiments.

In one or more embodiments, as illustrated in FIG. 5, there is an inflection point C near the intersection of the outline of the oscillating part 11 of the diaphragm 5 and the outline of the back chamber 2. Thus, establishing an inflection point C near the intersection of the outline of the oscillating part 11 of the diaphragm 5 and the outline of the back chamber 2 ensures more reliably that geometrically the line segment B will be longer than the width A of a support part 12 for the diaphragm 5; this is because the line segment B connects the intersection point between the outline of the oscillating part 11 of the diaphragm 5 and the outline of the back chamber 2 and another intersection point closest to the aforementioned intersection point on a different side of the oscillating part 11.

This includes cases where the inflection point C is a point and cases where the inflection point C is an area. That is, the inflection point C may be constructed so that the direction of the curve reverses on both sides of that point, or may be constructed so that the direction of the curve reverses on both ends of a region having a predetermined size (or length). Here, "nearness" may mean that the inflection point is the same point as the aforementioned intersection point, or may be slightly offset therefrom, (by, for example, no more than ±50 μm).

Figure 6:
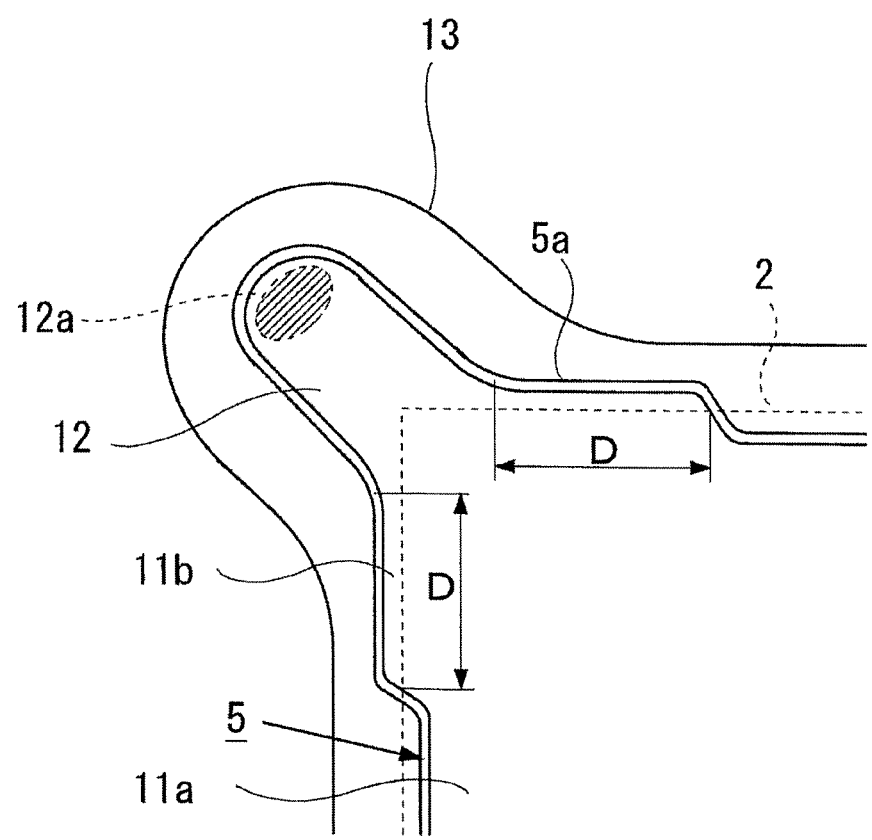
FIG. 6 is a third enlarged view of the supports for the diaphragm and near the end parts of the oscillating part in one or more embodiments.

Additionally, in one or more embodiments, as illustrated in FIG. 6, the length D of the end parts 11b of the oscillating part 11 of the diaphragm 5 which are formed outside the outline of the back chamber 2 is greater than or equal to 1/20 and less than or equal to 1/3 of the length of the sides of the oscillating part 11. It was determined via experimentation that with the length D of the end parts 11b of the oscillating part 11 of the diaphragm 5 formed outside the outline of the back chamber 2 within this range, it is possible to favorably balance suppressing the noise caused by Brownian motion of the air, and avoiding excess displacement of the diaphragm 5. Accordingly, one or more embodiments are capable of more reliably providing an acoustic sensor with both a high signal-to-noise ratio, and robustness to input pressure.

Figure 7A:
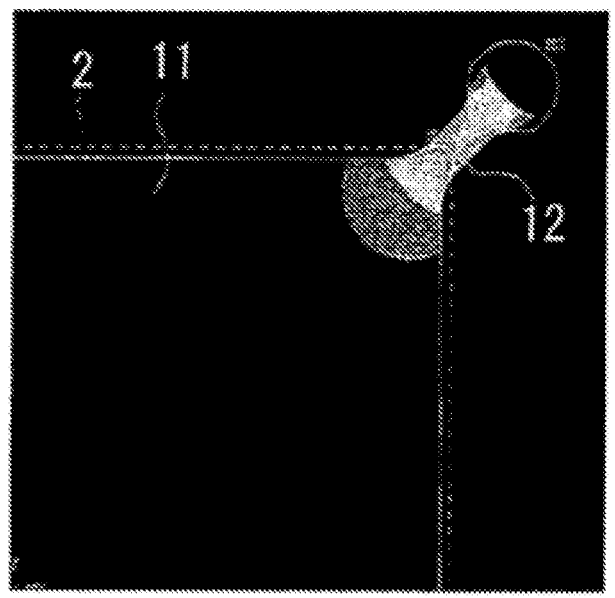
FIGS. 7A, 7B, and 7C illustrate stress distributions near the support of the diaphragms in a typical sensor and one or more embodiments.
Figure 7B:
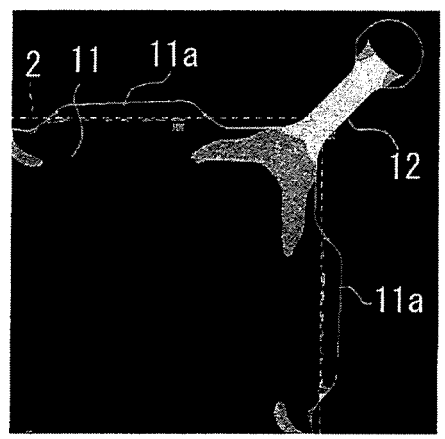
Figure 7C:
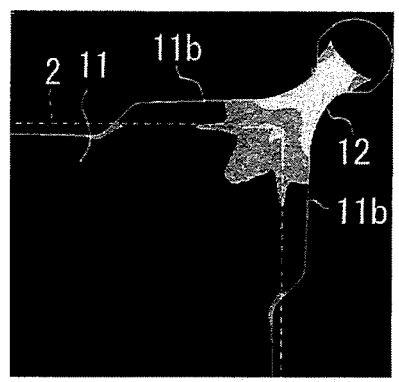

FIGS. 7A, 7B, and 7C illustrate a stress distribution near the supports 12 of the diaphragm 5 when a large pressure acts thereon from the back plate 7. FIG. 7A illustrates when the entire outline of the oscillating part 11 of the diaphragm 5 is inward of the back chamber 2; FIG. 7B illustrates when the end parts 11b of the outline of the oscillating part 11 of the diaphragm 5 is inward of the back chamber 2 and the center part 11a along the sides of the oscillating part 11 is outside the outline of the back chamber 2; and FIG. 7C illustrates when the center part 11a of the outline of the oscillating part 11 of the diaphragm 5 is located inward of the back chamber 2 and the end parts 11b along the sides of the oscillating part 11 are outside the outline of the back chamber 2.

As illustrated in the drawings, the stress distribution near the supports when a large pressure acts from the back plate 7 is slightly broader and mitigates the concentration of stress at the supports 12 when the end parts 11b of the outline of the oscillating part 11 of the diaphragm 5 are located inward of the back chamber 2 and the center parts 11a along the sides of the oscillating part are located outside the outline of the back chamber 2 compared to when all the outline of the oscillating part 11 is located inward of the outline of the back chamber 2.

Moreover, the stress distribution is even broader and further mitigates the concentration of stress at the supports 12 when the center part 11a of the outline of the oscillating part 11 of the diaphragm 5 is located inward of the back chamber 2 and the end parts 11b along the sides of the oscillating part 11 are located outside the outline of the back chamber 2 compared to when the end the parts 11b of the outline of the oscillating part of the diaphragm 5 is located inward of the back chamber 2 and the center part 11a along the sides of the oscillating part is located outside the outline of the back chamber 2.

The maximum stress acting on the supports 12 decreases by up to 60% when the center part 11a of the outline of the oscillating part 11 of the diaphragm 5 is located inward on the back chamber 2 and the end parts 11b along the sides of the oscillating part 11 are located outside the outline of the back chamber 2 compared to when the entire outline of the oscillating parts is located inward of the outline of the back chamber 2.

There was no meaningful difference observed in the signal-to-noise ratio when the entire outline of the oscillating part 11 was located inside the outline of the back chamber 2 compared to when the end parts 11b along the sides in the outline of the oscillating part 11 of the diaphragm 5 was located outside the outline of the back chamber 2.

Figure 8A:
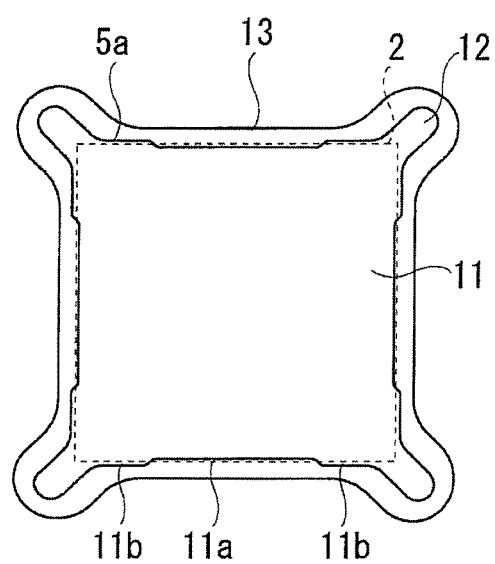
FIGS. 8A and 8B illustrate the shape of the diaphragm and the fixed membrane according to one or more embodiments; and illustrates a variation in the relationship with the outline of the back chamber.
Figure 8B:
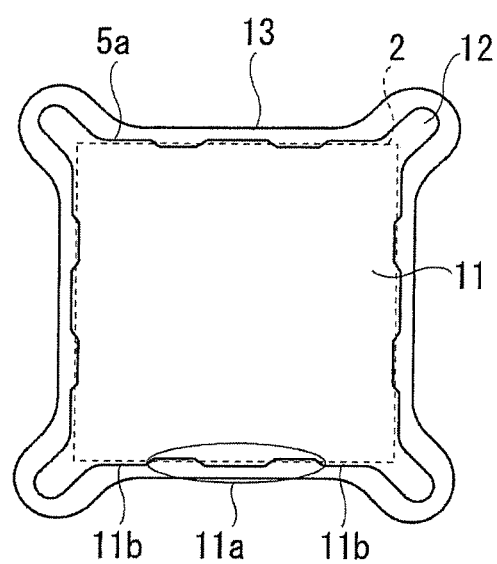

The above-mentioned one or more embodiments are described with the end parts 11b along the sides of the outline of the oscillating part 11 of the diaphragm 5 located outside the outline of the back chamber 2 and the entire center part 11a along the sides of the oscillating part 11 located inward of the outline of the back chamber 2. However, the oscillating part 11 is not limited to this form in one or more embodiments. FIGS. 8A and 8B illustrate a modification to the outline of the oscillating part 11 where a portion of the outline of the oscillating part 11 of the diaphragm 5 is located outside the outline of the back chamber 2. FIG. 8A and FIG. 8B are one or more embodiments where the outline of the back chamber 2 is a simple quadrilateral, and each side of the outline of the oscillating part 11 of the diaphragm 5 is modified.

More specifically, in FIG. 8A, as above described, the entire center part 11a along the sides of the outline of the oscillating part 11 of the diaphragm 5 is located inside the outline of the back chamber 2 and the end parts 11b along the sides of the outline of the oscillating part 11 are located outside the outline of the back chamber 2. In contrast, in FIG. 8B is one or more embodiments where an additional portion of the center part 11a along the sides of the outline of the oscillating part 11 of the diaphragm 5 is located outside the outline of the back chamber 2.

As illustrated with the variations in FIG. 8A and FIG. 8B, the device may be configured so that the end parts 11b of the sides of the outline of the oscillating part 11 are outside the outline of the back chamber 2. It was determined through experimentation that this configuration minimizes the concentration of stress on the supports 12 and greatly increases the robustness of the acoustic sensor 1 to input pressure. Therefore, based on the results of analyzing the stress distributions in FIGS. 7A, 7B, and 7C minimizing the displacement of the oscillating part 11 near the supports 12 is more effective at minimizing the stress concentrated at the supports 12. Therefore, in one or more embodiments, the end parts 11b close to the supports 12 in the outline of the oscillating part 11 should be outside the outline of the back chamber 2.

Figure 9A:
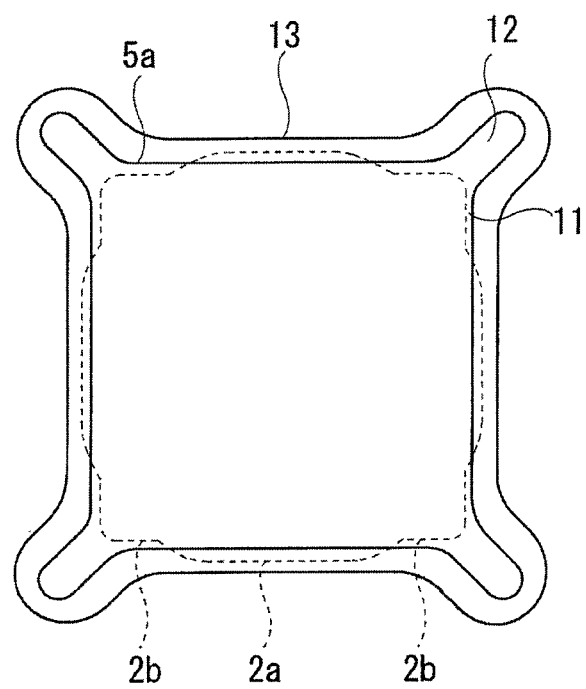
FIGS. 9A and 9B illustrate the shape of the diaphragm and the fixed membrane according to one or more embodiments; and illustrates another variation in the relationship with the outline of the back chamber.
Figure 9B:
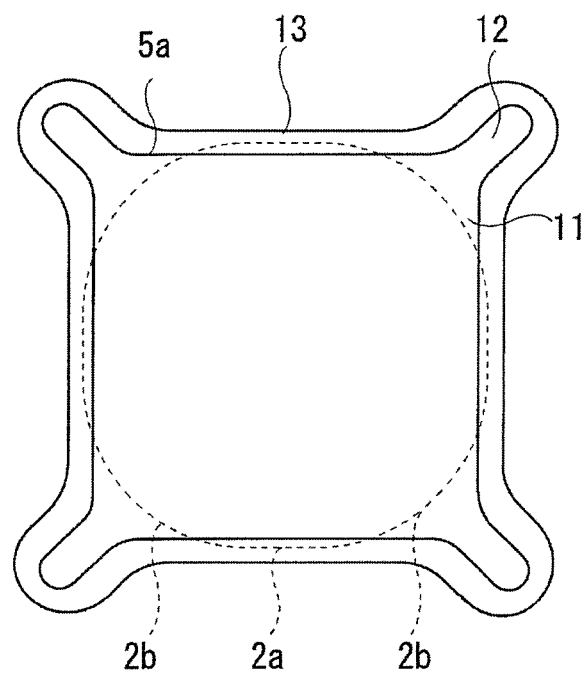

Next, FIGS. 9A and 9B illustrate a variation where the oscillating part 11 of the diaphragm 5 is a simple quadrilateral with the sides in the outline of the back chamber 2 modified. The center part 2a of the sides of the outline of the back chamber 2 protrude as illustrated in FIG. 9A and FIG. 9B; hereby, the center part of each side in the outline of the oscillating part 11 of the diaphragm 5 is inside relative to the outline of the back chamber 2. The center part 2a is also concave relative to the end parts 2b of the outline of the back chamber 2; hereby, the end parts of the sides of the outline of the oscillating part 11 are outside relative to the outline of the back chamber 2.

Figure 10A:
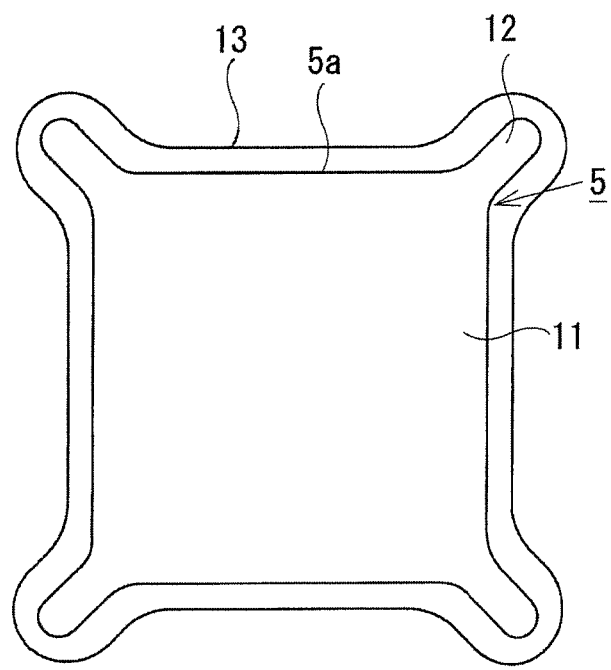
FIGS. 10A and 10B illustrate the types of the slit between the diaphragm and the fixed membrane in one or more embodiments and in a typical sensor.
Figure 10B:
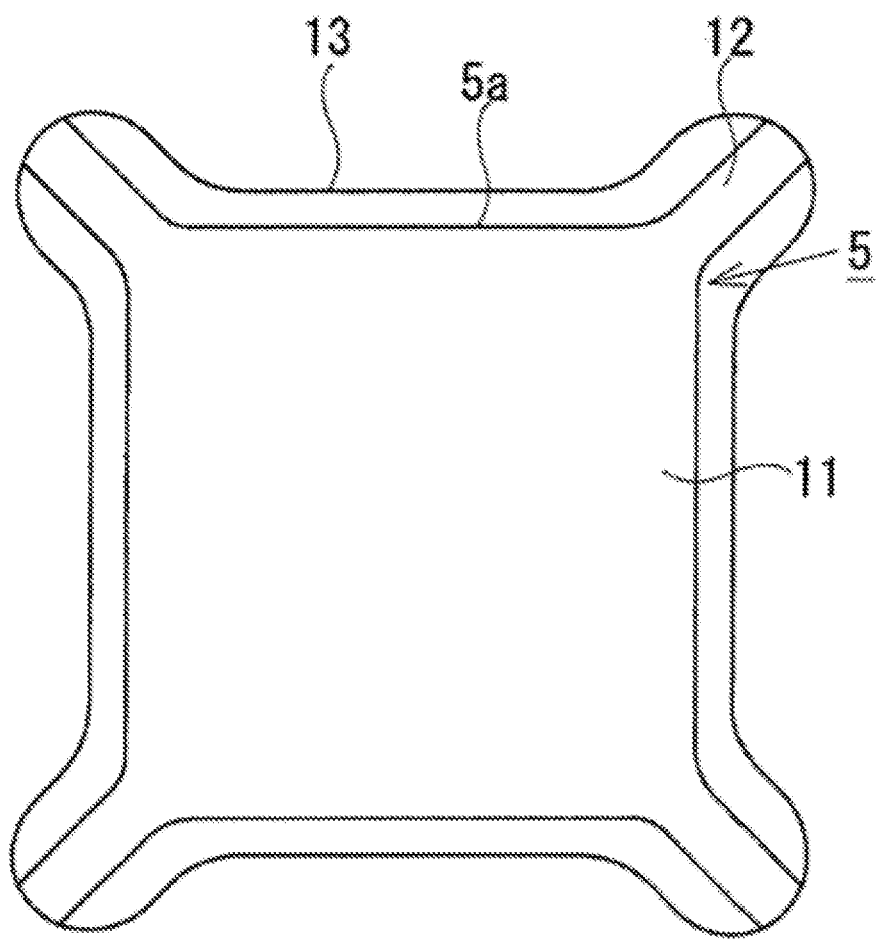

In one or more embodiments, the fixed membrane 13 surrounds the entire diaphragm 5 including the supports 12 as illustrated in FIG. 10A; and, the slit 5a is configured as a closed curve. During production, foreign objects may enter the exposed portion of the slit 5a, or create an unintended finish of the slit 5a; thus, with this in mind, the above configuration ensures the slit 5a between the diaphragm 5 and the fixed membrane 13 exposes the outer part of the fixed membrane 13.

In one or more embodiments, the area of the outline of the oscillating part 11 outside the outline of the back chamber 2 is established closer to the end parts 11b of the sides, i.e., closer to the supports 12. More specifically, in one or more embodiments, the end parts 11b are provided with convex stoppers that touch the substrate 3 when the oscillating part 11 is displaced toward the substrate 3.

Figure 11A:
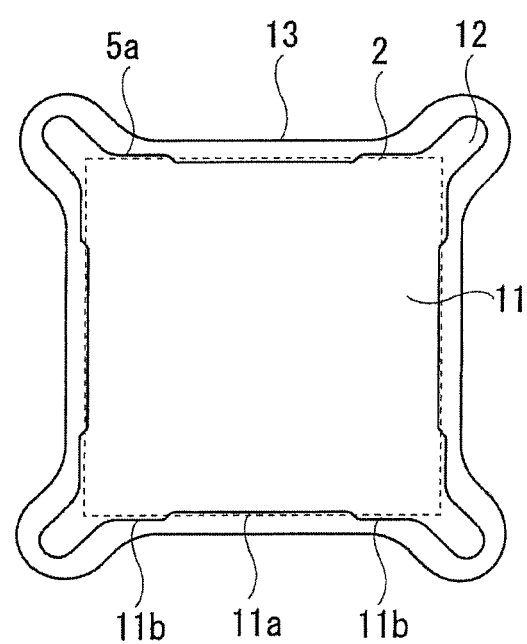
FIGS. 11A and 11B illustrate the shapes of a diaphragm in one or more embodiments.
Figure 11B:
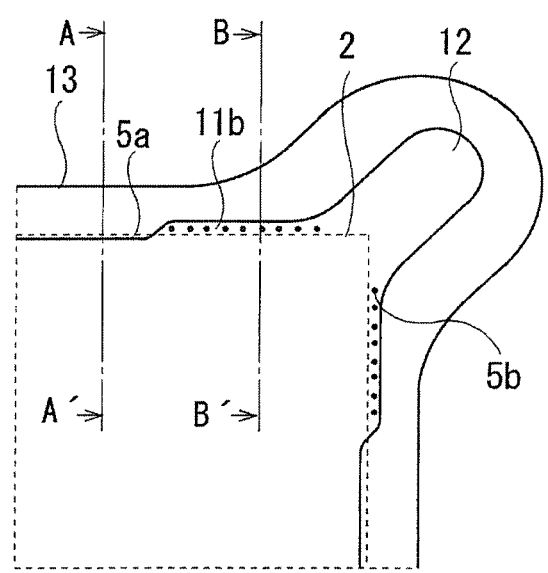
Figure 12A:
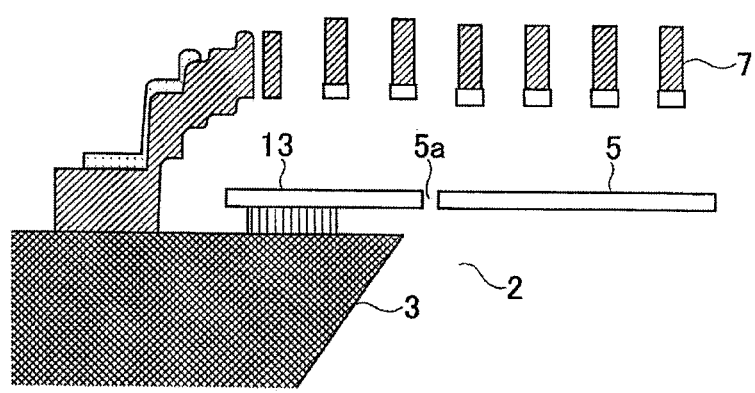
FIGS. 12A and 12B are cross-sectional views illustrating the shape of a diaphragm in one or more embodiments.
Figure 12B:
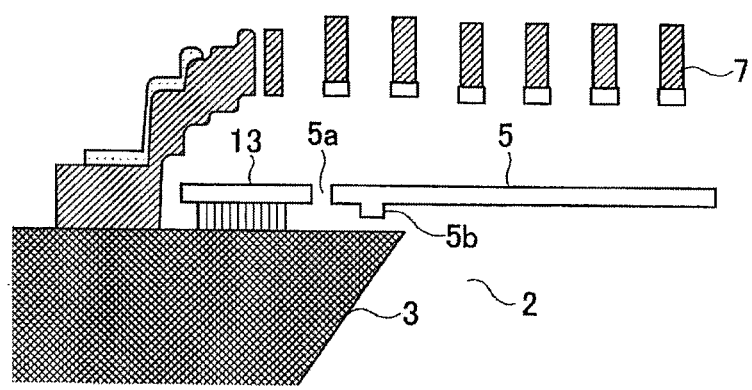

FIGS. 11A and 11B illustrate the oscillating part 11, supports 12, fixed membrane 13, and back chamber 2 of these one or more embodiments from the normal thereto; more specifically, FIG. 11A is an overall plan view; and FIG. 11B is an exploded view of near the supports 12. FIG. 12A illustrates the cross-section A-A' in FIG. 11B; and FIG. 12B illustrates the cross-section B-B' in FIG. 11B. As illustrated in FIG. 11B and FIG. 12B, particularly in one or more embodiments, a concave stopper 5b is provided on the oscillating part 11 toward the substrate 3 in the area of the outline of the oscillating part 11 outside the outline of the back chamber 2. Thus, the stopper 5b touches the outer surface of the substrate 3 when the oscillating part 11 displaces toward the back chamber 2 due to a large pressure acting thereon from the back plate 7. This reduces the contact surface area of the oscillating part 11 and the substrate 3 when the oscillating part 11 touches the substrate 3; further, this prevents the oscillating part 11 from sticking to the substrate 3 when the oscillating part 11 touches the substrate 3.

In one or more embodiments, the outlines of the oscillating part 11 and the back chamber 2 are no less than a predetermined distance apart where the outline of the oscillating part 11 and the outline of the back chamber 2 closest thereto forms a predetermined angle therewith.

Figure 13A:
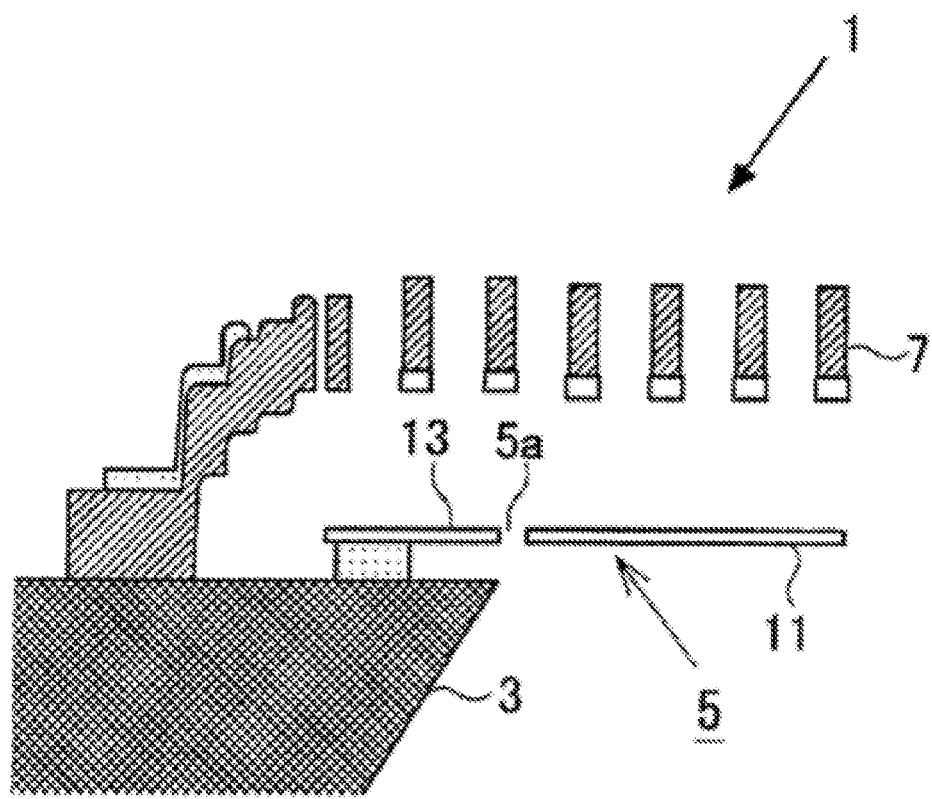
FIGS. 13A and 13B are for describing the issues with the diaphragm in a typical sensor.
Figure 13B:
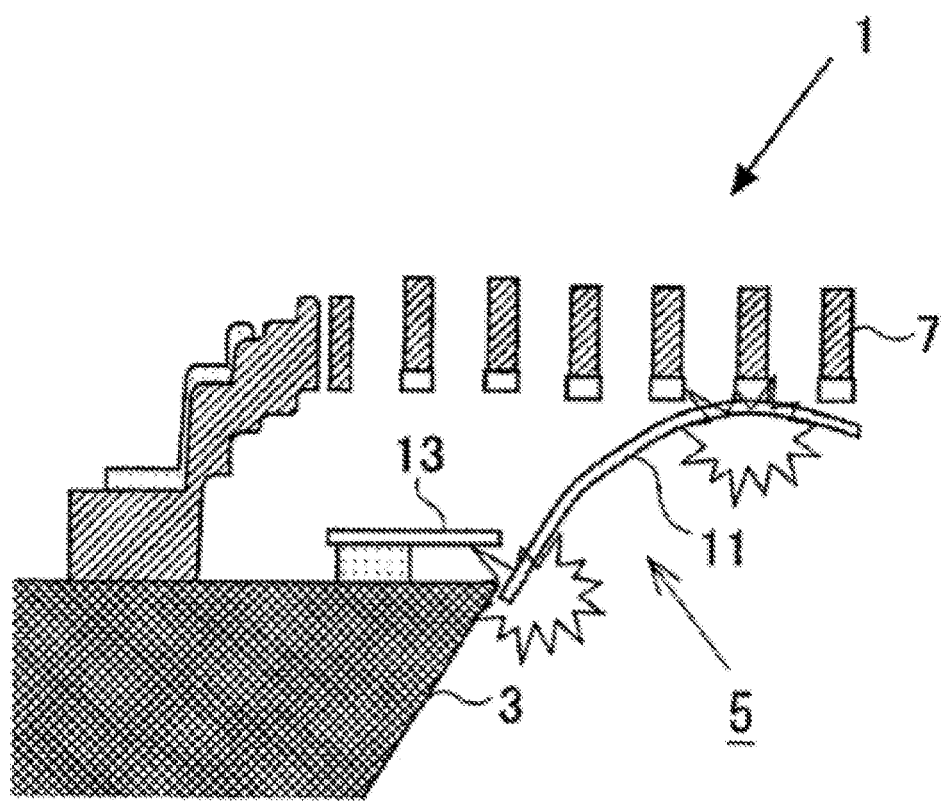

FIGS. 13A and 13B depict issues when the outline of the oscillating part 11 (i.e., the edges in the side view, referred to as the same below) are excessively close to the outline (edges) of the back chamber 2; more specifically, FIG. 13A depicts the relationship between the outline (edges) of the oscillating part 11 and the outline (edges) of the back chamber 2 when the diaphragm 5 is subject to pressure; and FIG. 13B depicts what may occur when the diaphragm 5 is subject to pressure.

That is, if the edges of the oscillating part 11 move too closely to the edges of the back chamber 2, the oscillating part 11 displaces momentarily in the opposite direction and enters the back chamber 2 when the oscillating part 11 is subjected to a large pressure from the back plate 7 as illustrated in FIG. 13A. In some cases when attempting to return to its initial position, the edges of the oscillating part 11 are caught on the edges of the back chamber 2 and the oscillating part 11 is unable to return to its initial position.

In contrast, in one or more embodiments, when viewed from the normal, the edges of the oscillating part 11 and the edges of the back chamber 2 closest thereto create a predetermined angle, e.g., no more than 3°. At this area in particular, the edges of the oscillating part 11 and the back chamber 2 are a predetermined distance apart, e.g., no less than 1 or no less than 3 μm.

Figure 14:
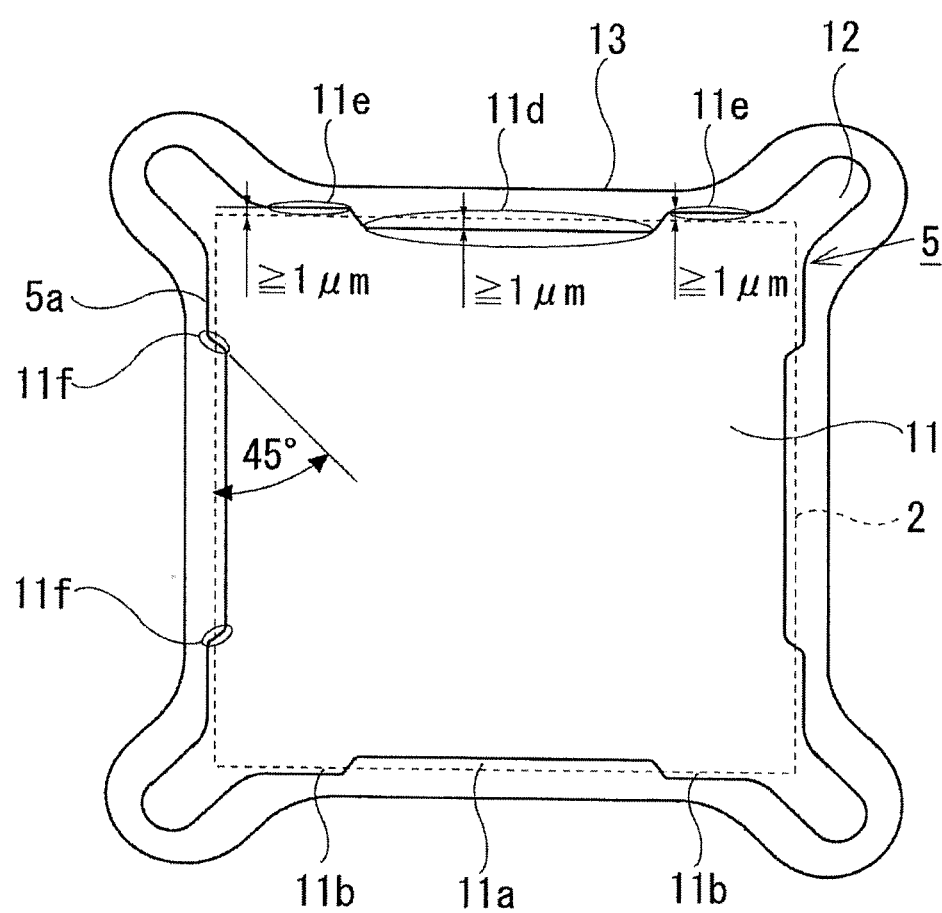
FIG. 14 illustrates the shape of the diaphragm and the fixed membrane according to one or more embodiments; and illustrates the relationship with the outline of the back chamber.

FIG. 14 illustrates a plan view of the diaphragm 5, the fixed membrane 13, and the outline of the back chamber 2 in one or more embodiments from the normal to the diaphragm 5. As can be understood from FIG. 14, the areas 11d, 11e where the outlines of the oscillating part 11 and the back chamber 2 closest thereto form an angle of no more than 3° are located no less than 1 μm away from the outline of the back chamber 2. Note that while only the areas 11d, 11e are given symbols, the other three sides of the outline are configured identically.

Hereby, the outline of the oscillating part 11 is no less than 1 μm away from the outline of the back chamber 2 outside where the outlines of the oscillating part 11 and back chamber 2 closest thereto forms a large angle, e.g., outside sections 11f where the outlines intersect. This minimizes the likelihood that, when subject to a large pressure from the back plate 7, the edges of the oscillating part 11 will stick to the edges of the back chamber 2 and fail to return to its initial position. Thus, it is possible to avoid a situation where the oscillating part 11 bows and the center region touches the back plate 7.

Note that in one or more embodiments, the outline of the oscillating part 11 is set no less than 1 μm apart from the edge of the back chamber 2 specifically where the outlines of the oscillating part 11 and the back chamber 2 closest thereto form an angle if no more than 3°; this area is selected for the following reasons. In other words, the idea is that the edges of the oscillating part 11 will tend not to stick to the edges of the back chamber 2 with a certain angle between the edges of the back chamber 2 and the oscillating part 11; and that this includes cases where the edges of the oscillating part 11 and the back chamber 2 intersect.

In one or more embodiments, the closest outline of the back chamber 2 may be the portion of the outline with the shortest distance to a predetermined region of the outline of the oscillating part 11. The closest outline of the back chamber 2 may be the portion of the outline of the back chamber 2 that intersects with a line perpendicular to the outline of the diaphragm when viewed from the normal to the diaphragm. Alternatively, the closest outline of the back chamber 2 may be where the outline of the back chamber 2 intersects with a straight line drawn from the center part of the oscillating part 11 (i.e., the intersection of symmetry lines when the oscillating part 11 is quadrilateral; or the center when the oscillating part 11 is a circle) passes through the aforementioned region when viewed from the normal to the oscillating part 11.

As illustrated in FIG. 14, in one or more embodiments, the angle where the outlines of the oscillating part 11 and the back chamber 2 intersect is taken as 45°. If the intersection angle is greater than 30°, it is thereby possible to minimize the changes in surface area where the outline of the oscillating part 11 of the diaphragm 5 is arranged outside the outline of the back chamber 2. This can be the case even if there are differences in the location of the outline when producing the back chamber 2. In other words, it is possible to stabilize the size of the area where the oscillating part 11 of the diaphragm 5 overlaps the silicon substrate 3 outside the back chamber 2 in a plan view.

One or more embodiments described are an example of the oscillating part in the diaphragm having shapes besides quadrilateral.

Figure 15A:
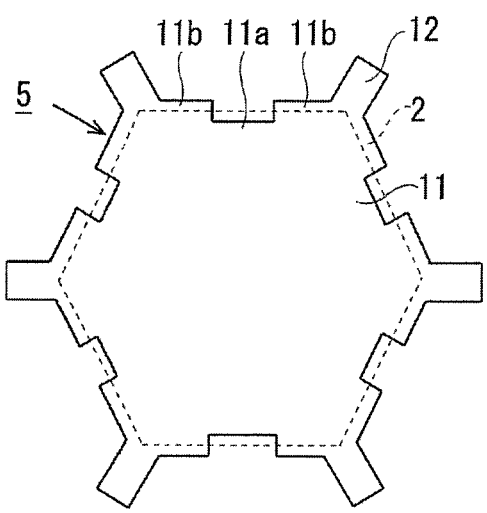
FIGS. 15A, 15B, and 15C illustrate the shapes of the diaphragm and the fixed membrane according to one or more embodiments; and illustrate a variation in the relationship with the outline of the back chamber.
Figure 15B:
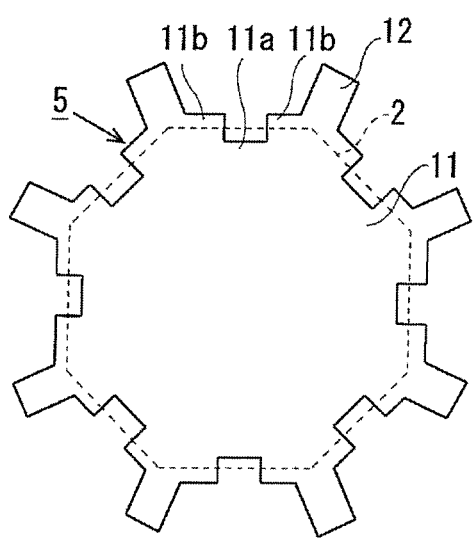
Figure 15C:
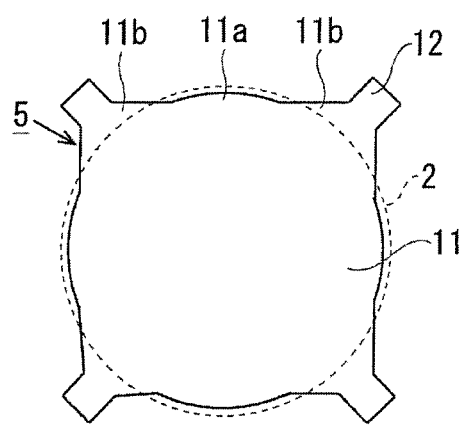

FIGS. 15A, 15B, and 15C illustrate variations in the outline of the diaphragm 5 in one or more embodiments; FIG. 15A is one or more embodiments where the outlines of the back chamber 2 and the oscillating part 11 of the diaphragm 5 are substantially hexagonal. In this case, a total of six supports 12 are provided radiating from the corners. FIG. 15B is one or more embodiments where the outlines of the back chamber 2 and the oscillating part 11 of the diaphragm 5 are substantially octagonal. In this case, a total of eight supports 12 are provided radiating from the corners. FIG. 15C is one or more embodiments where the back chamber 2 has a circular outline, and the oscillating parts 11 of the diaphragm 5 has a substantially quadrilateral outline with the center part 11a arced outward. In this case, a total of four supports 12 are provided radiating from the corners similarly to one or more embodiments.

Thus, the shape of the oscillating part and the number of supports may be modified as appropriate in accordance with the shape of the substrate and the requirements for the capacitive sensor. As can be understood from FIGS. 15A, 15B, and 15C, the outline of the oscillating part 11 is inside the outline of the back chamber 2 at the center part 11a, and outside the outline of the back chamber 2 at the end parts 11b. However, any part of the outline of the oscillating part 11 may be located outside the outline of the back chamber 2; additionally, whether any part of the outline of the oscillating part 11 is located inside the outline of the back chamber 2 may certainly be modified as appropriate in accordance with the requirements for the capacitive sensor.

The one or more embodiments described are an example of mixing together regions of the outline of the oscillating part of the diaphragm that intersect with the opening in the substrate and other regions of the outline that do not intersect with the opening.

Figure 16A:
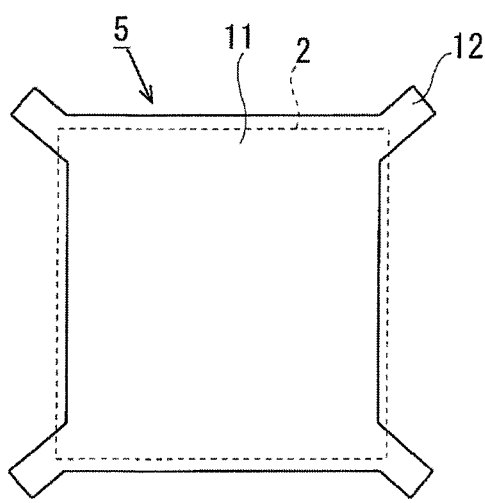
FIGS. 16A, 16B, and 16C illustrate the shapes of the diaphragm and the fixed membrane according to one or more embodiments; and illustrate a variation in the relationship with the outline of the back chamber.
Figure 16B:
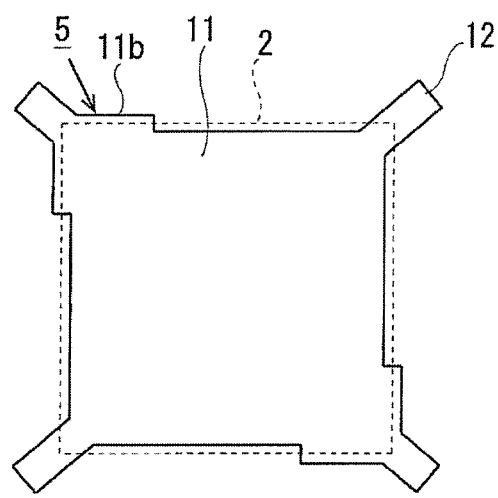
Figure 16C:
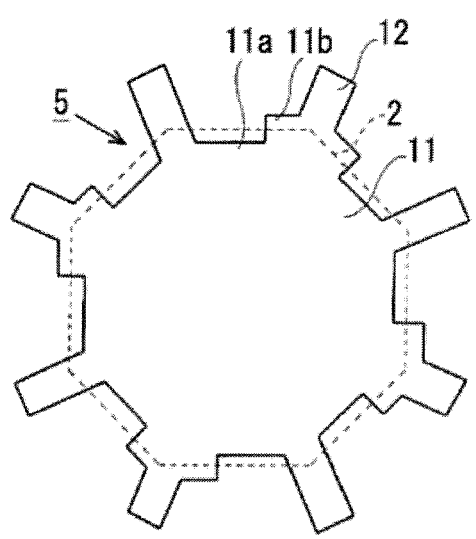

FIGS. 16A, 16B, and 16C illustrate variations in the outline of the diaphragm 5 in these one or more embodiments; FIG. 16A is one or more embodiments where the oscillating part 11 is substantially quadrilateral. The opposing top and bottom sides thereof are outside the outline of the back chamber 2, and the opposing left and right sides are located on the inside. FIG. 16B is one or more embodiments where the oscillating part 11 is substantially quadrilateral, and the end of parts 11b are located near two opposing angles with no end parts 11b at the remaining two opposing angles. FIG. 16C is one or more embodiments where the outlines of the back chamber 2 and oscillating part 11 of the diaphragm 5 are substantially octagonal; apex angles with end parts 11b alternate with apex angles with no end parts 11b.

Thus, the diaphragm 5 in one or more embodiments, simply needs to possess an intersecting structure where the outline of the diaphragm 5 and the outline of the opening in the substrate intersect in at least one or more locations when viewed from the normal to the diaphragm 5. This includes mixing together regions where the outlines of the oscillating part 11 of the diaphragm 5 and the back chamber 2 have an intersection point, and regions where the outlines of the oscillating part 11 and the back chamber 2 do not have an intersection point.

The one or more embodiments described are an example where the outline of the oscillating part in the diaphragm is substantially circular.

Figure 17:
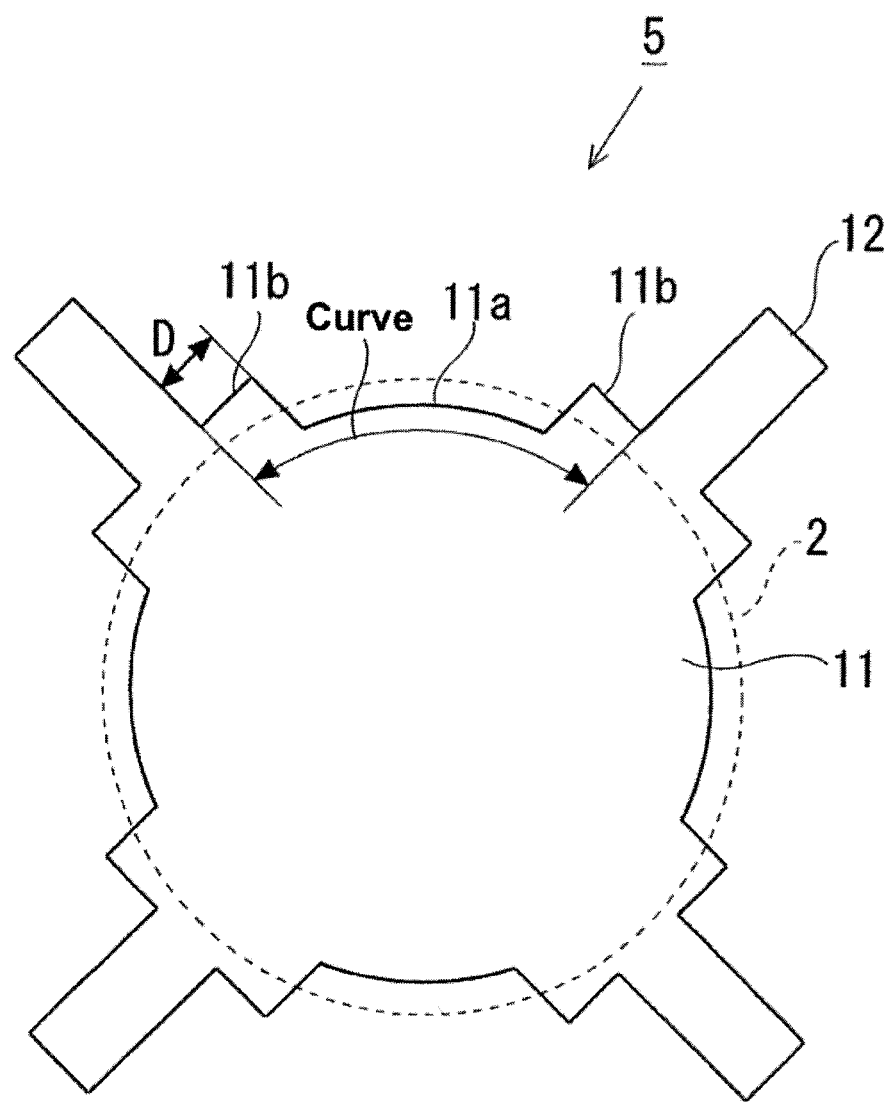
FIG. 17 illustrates the shape of a diaphragm in one or more embodiments.
Figure 18A:
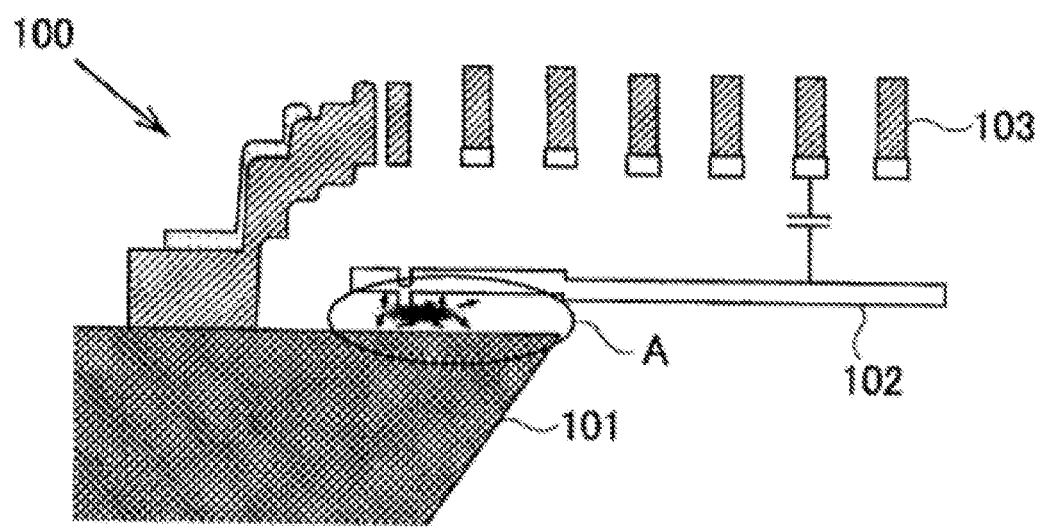
FIGS. 18A and 18B are partial cross-sectional views of one or more embodiments of a typical acoustic sensor.
Figure 18B:
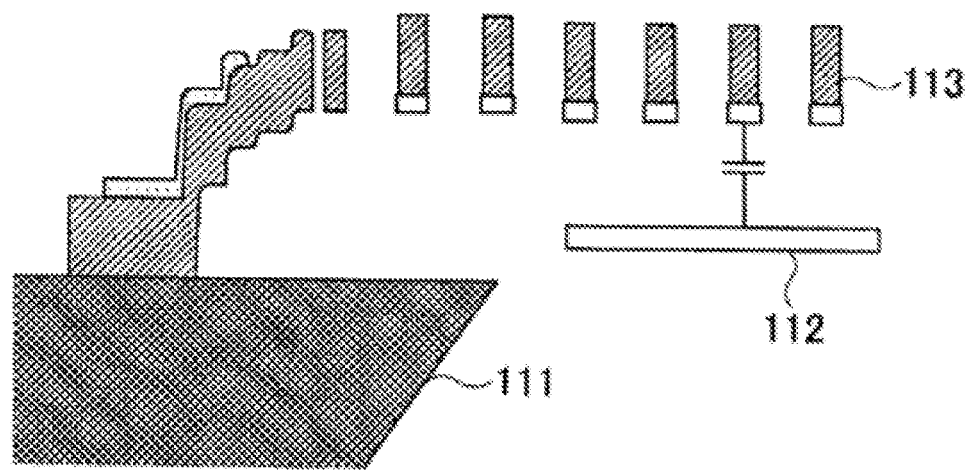
Figure 19A:
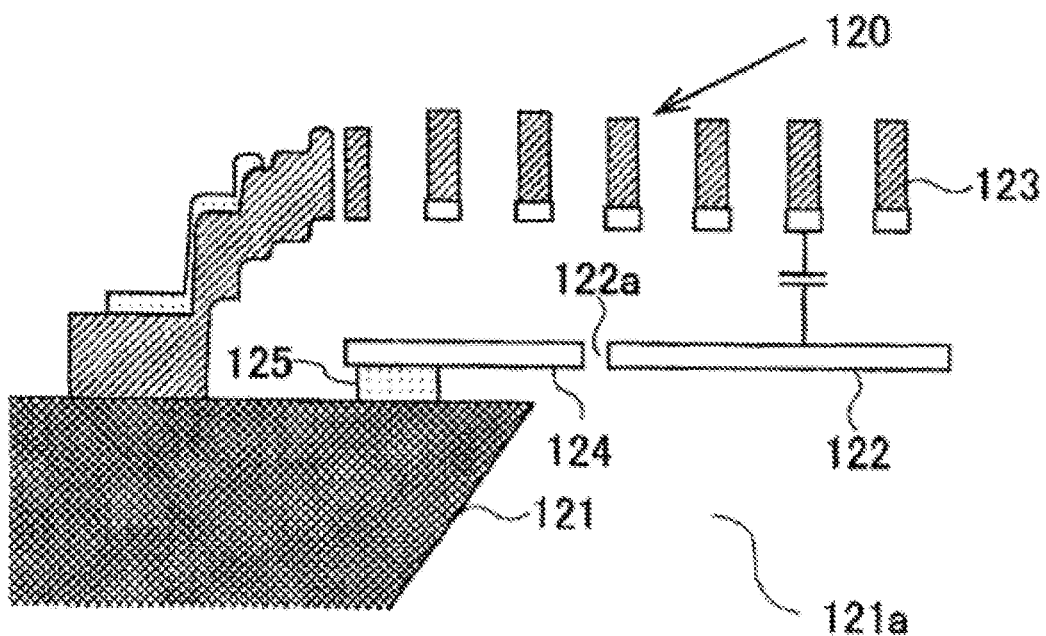
FIGS. 19A and 19B are partial cross-sectional views of one or more embodiments of a typical acoustic sensor.
Figure 19B:
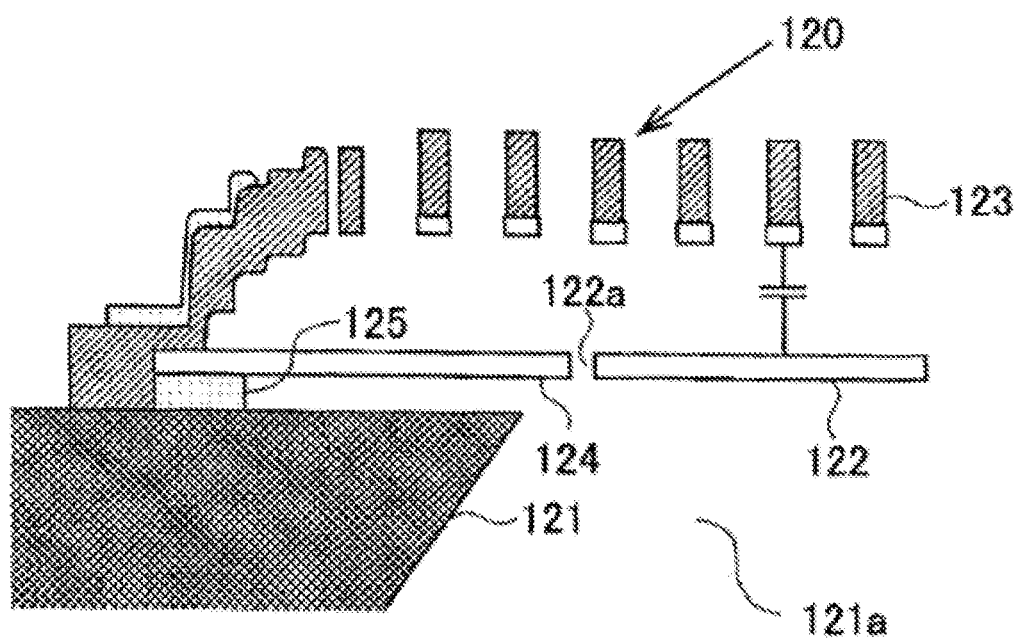

FIG. 17 illustrates when the outline of the oscillating part 11 in the diaphragm 5 in one or more embodiments is circular. In one or more embodiments, four supports 12 separated by 90° extend along the radius. In addition, the end of parts 11b are provided at both ends of a curved section between supports 12. The outline of the oscillating part 11 is outside the outline of the circular back chamber 2 at the end parts 11b. The outline of the oscillating part 11 is inside the outline of the circular back chamber 2 at the center part 11a of the curved section between supports 12. Note that the curved section between supports 12 in the diaphragm 5 in FIG. 17 corresponds to a curved line constituting the closed curve in one or more embodiments.

In this manner, the outline of the oscillating part 11 in the diaphragm 5 in one or more embodiments is not limited to a polygon such as a tetragon. These one or more embodiments are an example of the outline of the oscillating part 11 being a circle; however, the outline of the oscillating part 11 may be a closed curve other than a circle.

One or more embodiments provide examples where the supports 12 of the diaphragm 5 are secured to the substrate 3 via anchors 12a; however, the supports 12 for the diaphragm 5 may be secured to the back plate 7 via anchors 12a. One or more embodiments provide examples of applying one or more embodiments to a capacitive sensor; however, one or more embodiments may be applied to other types of sensors. For example, one or more embodiments may be similarly adopted in a piezoelectric sensor. Here, the diaphragm is made up of a material that exhibits the piezoelectric effect, and displacement of the diaphragm is detected as changes in the piezoelectric voltage. In this case, no back plate is needed.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

The invention claimed is:

1. A MEMS structure comprising:
a substrate having an opening;
a diaphragm arranged opposite the opening in the substrate;
a plurality of anchors securing the diaphragm to the substrate or to another component; and
a fixed membrane surrounding the diaphragm over a slit;
wherein the outline of the diaphragm protrudes toward the anchors, and includes a predetermined intersecting structure that when viewed from the normal to the diaphragm, the diaphragm protrudes toward the anchors in at least one location on the diaphragm between two intersection points of the outline of the diaphragm and the outline of the opening in the substrate;
wherein the intersecting structure is configured such that:
the distance between the two intersection points is greater than the width of the diaphragm at a location closest to an anchor,
wherein the outline of the diaphragm includes an inflection point near the intersection point and two curves in opposite directions on both sides of the intersection point; and
wherein the outline of the diaphragm has an intersection angle of no less than 30° at the intersection points when the outline of the diaphragm intersects with the outline of the opening in the substrate.

2. The MEMS structure according to claim 1, wherein:
the outline of the diaphragm is a polygon or substantially a polygon; and
the length of a section on one side of the outline of the diaphragm located outside the outline of the opening in the substrate is no less than 1/20 and no more than 1/3 the length of the one side.

3. The MEMS structure according to claim 2, wherein:
the section of the outline of the diaphragm inward of the opening in the substrate when viewed from the normal to the diaphragm is located at the center part of one side of the polygon or a curve making up the closed curve, and
the section of the outline of the diaphragm outward of the opening in the substrate when viewed from the normal to the diaphragm is located at both ends of the center part of one side of the polygon or the curve making up the closed curve.

4. A capacitive sensor comprising:
a MEMS structure according to claim 2; and
a backplate arranged opposite the diaphragm with an air gap therebetween.

5. The MEMS structure according to claim 1, wherein:
the diaphragm is provided with a stopper projecting toward the substrate in a section of the outline of the diaphragm located outside the opening in the substrate, and
the stopper is configured to touch the substrate when the diaphragm is displaced.

6. The MEMS structure according to claim 1, further comprising a backplate provided at an opposite side of the substrate to the diaphragm by depositing a fixed electrode onto a fixed plate, wherein the fixed membrane that is provided differently from the fixed plate, is configured to completely surround the diaphragm over a slit formed between the diaphragm and the fixed membrane, from outside when viewed from the normal to the diaphragm, and the slit is configured as a closed curve.

7. The MEMS structure according to claim 1, wherein:
a region in the outline of the diaphragm creating an angle of no more than 3° with the outline of the opening in the substrate that is closest thereto is no less than 1 μm from the outline of the opening in the substrate.

8. A capacitive sensor comprising:
a MEMS structure according to claim 1; and
a backplate arranged opposite the diaphragm with an air gap therebetween.

9. The capacitive sensor according to claim 8, wherein the anchor secures the diaphragm to the back plate.

10. A piezoelectric sensor comprising:
a MEMS structure according to claim 1; and
the diaphragm exhibits the piezoelectric effect.

11. An acoustic sensor comprising:
a capacitive sensor according to claim 8, and
the acoustic sensor converting acoustic pressure to changes in the capacitance between the diaphragm and the back plate to detect the acoustic pressure.

12. An acoustic sensor comprising:
a piezoelectric sensor according to claim 10, and
the acoustic sensor converting acoustic pressure to changes in the piezoelectric voltage on the diaphragm to detect the acoustic pressure.

* * * * *